(12) United States Patent
Tsuchido

(10) Patent No.: US 7,498,723 B2
(45) Date of Patent: Mar. 3, 2009

(54) PIEZOELECTRIC RESONATOR AND METHOD FOR MANUFACTURING THEREOF

(75) Inventor: Kenji Tsuchido, Minowa-machi (JP)

(73) Assignee: Epson Toyocom Corporation, Tokyo (JP)

( * ) Notice: Subject to any disclaimer, the term of this patent is extended or adjusted under 35 U.S.C. 154(b) by 81 days.

(21) Appl. No.: 11/790,644

(22) Filed: Apr. 26, 2007

(65) Prior Publication Data
US 2007/0252480 A1 Nov. 1, 2007

(30) Foreign Application Priority Data
May 1, 2006 (JP) .............................. 2006-127407
Feb. 27, 2007 (JP) .............................. 2007-046583

(51) Int. Cl.
H01L 41/053 (2006.01)
H01L 41/08 (2006.01)

(52) U.S. Cl. ..................................................... 310/348

(58) Field of Classification Search ................. 310/340, 310/344, 348
See application file for complete search history.

(56) References Cited

U.S. PATENT DOCUMENTS
2004/0174092 A1* 9/2004 Iwata ......................... 310/324

FOREIGN PATENT DOCUMENTS
JP A-2000-223997 8/2000
JP A-2002-076826 3/2002

* cited by examiner

Primary Examiner—Jaydi SanMartin
(74) Attorney, Agent, or Firm—Oliff & Berridge, PLC

(57) ABSTRACT

A piezoelectric resonator includes a resonator substrate, a base substrate supporting the resonator substrate, a lid substrate covering a surface of the resonator substrate, the surface being on an opposite side of a surface facing the base substrate, a first excitation electrode formed on the surface of the resonator substrate facing the lid substrate, a second excitation electrode formed on the surface of the resonator substrate facing the base substrate, and a third electrode provided on the surface of the resonator substrate facing the base substrate, the third electrode being electrically connected to the first excitation electrode through a concave portion which is formed on a side surface of the resonator substrate.

1 Claim, 8 Drawing Sheets

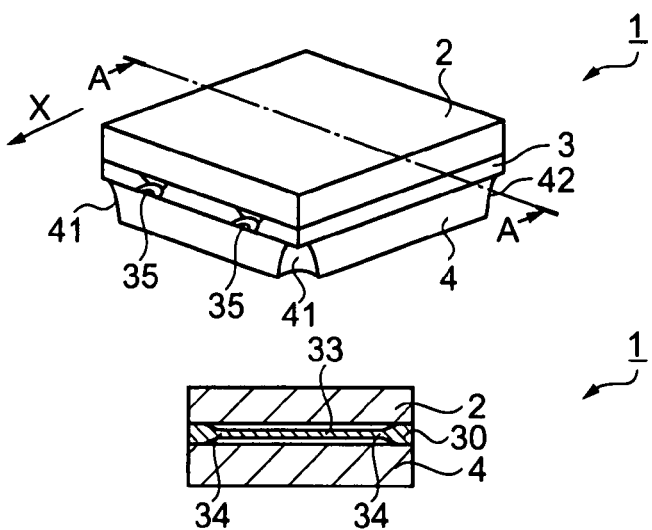
FIG. 1A
FIG. 1B
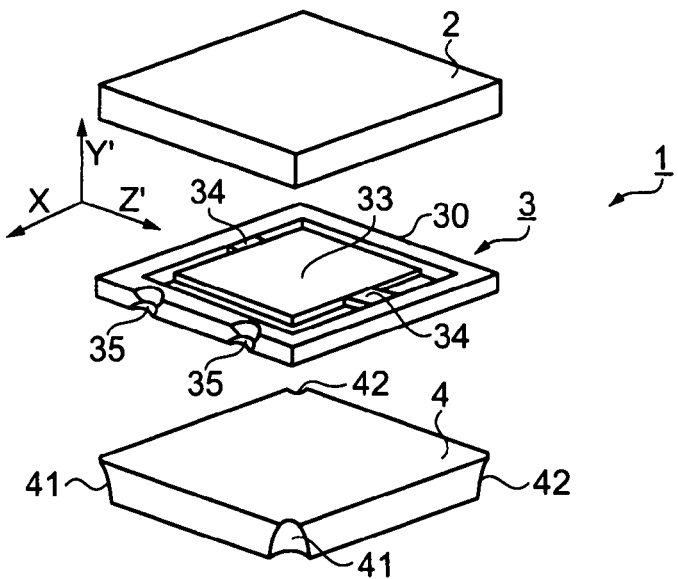
FIG. 2
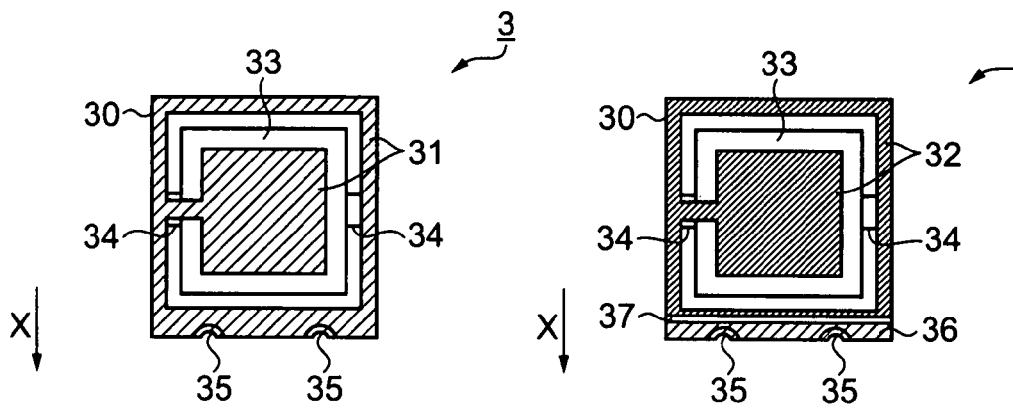
FIG. 3A
FIG. 3B

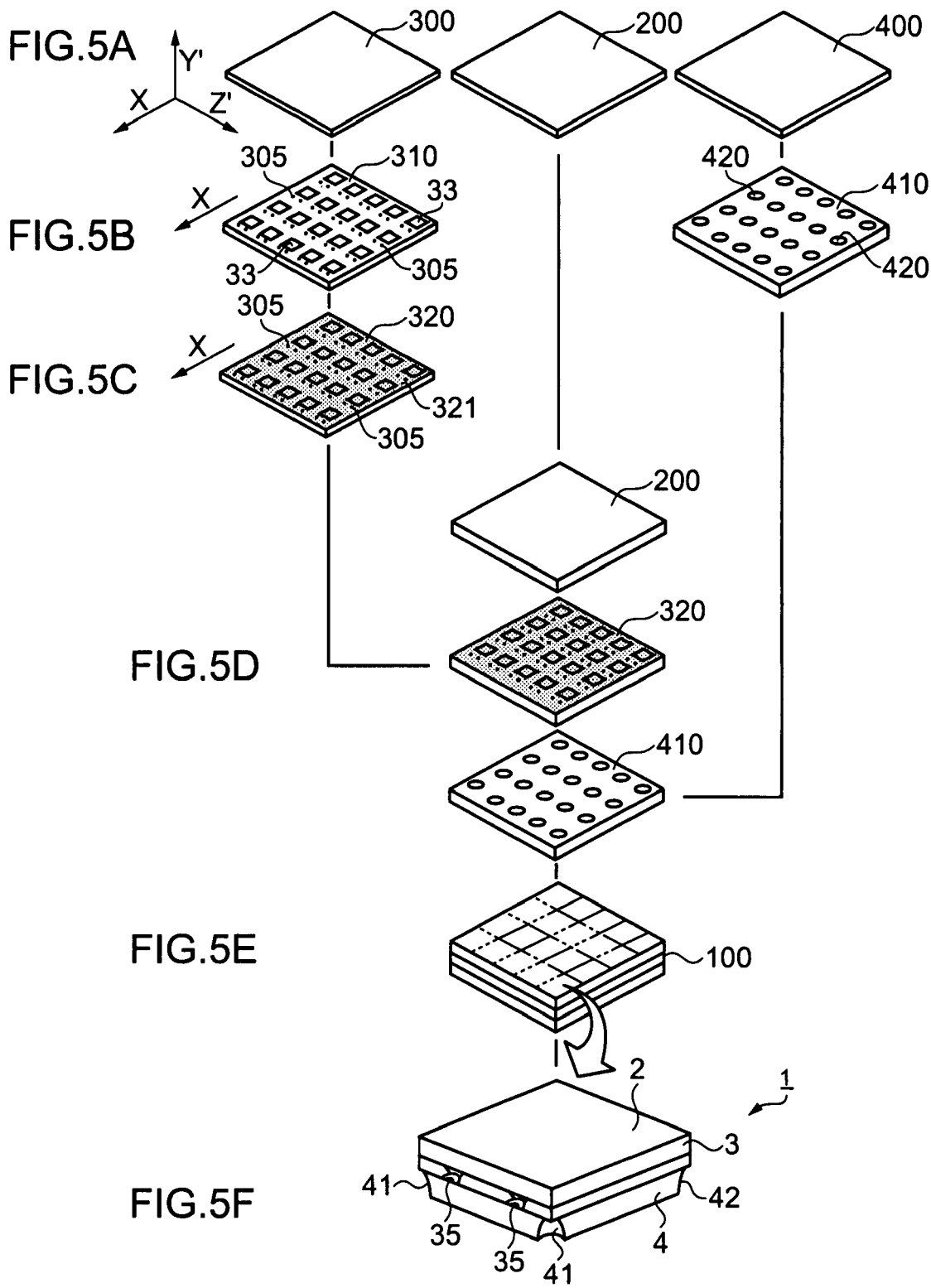

PIEZOELECTRIC RESONATOR AND METHOD FOR MANUFACTURING THEREOF

BACKGROUND OF THE INVENTION

1. Technical Field

The present invention relates to a piezoelectric resonator used for a small sized electronic apparatus and a method for manufacturing the same.

2. Related Art

The small sized electronic apparatus has been required to be miniaturized further. It is demanded that the piezoelectric resonator becomes smaller which is used for the small sized electronic apparatus.

Here, a resonator element included in the piezoelectric resonator is necessary to have a vibration area as large as possible, because the larger the vibration area is, the smaller the crystal impedance is, allowing the resonator element to vibrate well. Therefore, it is necessary for the resonator element to be contained in a package reduced in size in order to miniaturize the piezoelectric resonator, securing the vibration area of the resonator element. There is a need for an arrangement of an electrode provided in the package to be improved in order to miniaturize the package.

For the reason above, the following approaches have been made, for example. Specifically, an excitation electrode provided to the resonator element on an opposite surface thereof is extracted compactly to miniaturize the package. At the same time, two excitation electrodes as connection electrodes are collected on one surface of the package so as to be connected to a substrate mounting the package with as small area as possible.

As an example of the approaches, there has been known that the resonator substrate provided with the resonator element has a through-hole formed thereon through which is extracted to one surface of the substrate an excitation electrode provided on the other surface, so that two excitation electrodes is collected on one surface of the package (refer to an example of related art listed below, for example).

JP-2002-76826 is an example of related art (paragraphs 0012 to 0014 in page 3, FIGS. 2 to 4).

If the through-hole is provided, the resonator substrate needs an area to be formed with the through-hole. As a result, the resonator substrate with the through-hole is larger than that with no through-hole even if containing the same sized resonator element. Thus, miniaturization of the piezoelectric resonator is restricted to some degree.

SUMMARY

An advantage of the present invention is to provide a piezoelectric resonator reduced in size and a method for manufacturing the same.

A piezoelectric resonator of a first aspect of the invention includes a resonator substrate, a base substrate supporting the resonator substrate, a lid substrate covering a surface of the resonator substrate, the surface being on an opposite side of a surface facing the base substrate, a first excitation electrode formed on the surface of the resonator substrate facing the lid substrate, a second excitation electrode formed on the surface of the resonator substrate facing the base substrate, and a third electrode provided on the surface of the resonator substrate facing the base substrate, the third electrode being electrically connected to the first excitation electrode through a concave portion which is formed on a side surface of the resonator substrate.

In this case, the first excitation electrode formed on one surface of the resonator element is electrically connected to the third electrode formed on the surface on which the second excitation electrode is formed via the concave portions on the side surface of the resonator substrate. Therefore, the first excitation electrode may be collected to the surface on which the second excitation electrode is formed to allow the piezoelectric resonator to be mounted with one surface of the package. Further, the electrical connecting is made between the first excitation electrode and the third electrode via the side surface, not via the through-hole. Hence, the resonator substrate dose not need an area to be penetrated, and may have a smaller size compared to that using the same sized resonator element. As a result, the piezoelectric resonator reduced in size may be obtained.

Moreover, since the first excitation electrode is electrically connected to the third electrode via the concave portions, it is able to reduce electrical disconnection and discharge due to contact from the outside.

In the piezoelectric resonator, it is preferable that the resonator substrate be made of quartz crystal, and the concave portion be formed by wet etching the quartz crystal.

In this case, the concave portion is formed by wet etching the resonator substrate made of quartz crystal. Therefore, the side surface of the concave portion may be tapered due to crystal anisotropy of quartz crystal to allow easily forming an electrode on the side surface.

In the piezoelectric resonator, it is preferable the resonator substrate have the side surface in a direction of an X-axis as a crystal axis of the quartz crystal, and the concave portion be formed on the side surface located in a positive direction of the X-axis. In this case, the side surface of the concave portion provided to the side surface of the resonator substrate may have an inclination more steeply in the negative direction of the X-axis than in the positive direction of the X-axis due to anisotropy of wet etching for the crystal axis of quartz crystal. Therefore, the area ratio of the concave portion to the resonator substrate may be decreased, and the resonator element may occupy a large area in the resonator substrate. Since the concave portion has the steeply inclined side surface, it may be reduced that the first excitation electrode and the third electrode are electrically disconnected at the side surface of the concave portion.

A method for manufacturing a piezoelectric resonator of a second aspect of the invention includes preparing a resonator substrate member, a base substrate member and a lid substrate member; forming a plurality of resonator elements and a penetrating hole corresponding to each of the resonator elements on the resonator substrate member; after forming the resonator substrate member, forming a first excitation electrode on at least a part of the resonator element on one main surface of the resonator substrate member and, forming an electrode connected to the first excitation electrode on at least a part of an internal surface of the penetrating hole, forming a second excitation electrode on at least a part of the resonator element on the other main surface of the resonator substrate member, forming a third electrode on at least a part of the other main surface, forming an electrode connected the third electrode on at least of the internal surface of the penetrating hole, and electrically connecting the first excitation electrode and the third electrode in the internal surface of the penetrating hole; forming a plurality of holes each corresponding to the resonator element on the base substrate member; bonding the lid substrate member and the base substrate member to the resonator substrate member in such a manner that the lid substrate member is bonded to the resonator substrate member on the surface on which is formed the first excitation electrode, and the base substrate member is bonded to the resonator substrate member on the surface on which is formed the second excitation electrode such that the resonator element corresponds to the holes of the base substrate member; and cutting a substrate member obtained by bonding the lid substrate member, the resonator substrate member and the base substrate member so as to leave a part of the internal surface of the penetrating hole, the left part of the internal surface being on the side of the resonator element corresponding to the penetrating hole, to obtain the piezoelectric element.

In this case, the first excitation electrode provided to one surface of the resonator substrate member may be electrically connected to the third electrode formed on the other surface of the resonator substrate member on which is formed the second excitation electrode via the penetrating hole of the resonator substrate member. Cutting is performed so as to leave a part of the internal surface of the penetrating hole, which part is on the side of the resonator element corresponding to the penetrating hole, to obtain the piezoelectric element. Therefore, the first excitation electrode may be collected to the surface on which the second excitation electrode is formed to obtain the piezoelectric resonator capable of being mounted with one surface of the package. Further, the electrical connecting is made between the first excitation electrode and the third electrode via a part of the internal surface of the penetrating hole, not via the through-hole, and cutting is performed along the penetrating holes. Thus, it is not necessary to provide particularly the through-hole to the resonator substrate member, allowing piezoelectric resonator to have a smaller size compared to that using the same sized resonator element. As a result, the number of the piezoelectric resonator obtained from one resonator substrate member may be increased.

In the method, the resonator substrate member forming step preferably includes, forming a first corrosion-resistant film on both main surfaces of the resonator substrate member; removing the first corrosion-resistant film on a penetrating hole portion to be formed therein with the penetrating hole, patterning the penetrating hole portion; forming the penetrating hole in the penetrating hole portion from which the first corrosion-resistant film has been removed; removing the first corrosion-resistant film on a inverted-mesa portion to be formed therein with the resonator element, patterning the inverted-mesa portion; forming the inverted-mesa by etching the inverted-mesa portion from which the first corrosion-resistant film has been removed, and etching the penetrating hole to be widened at the same time; stripping the first corrosion-resistant film and forming a second corrosion-resistant film on the surface of the resonator substrate member after removing the first corrosion-resistant film therefrom; removing the second corrosion-resistant film on a cut-out portion between the resonator element and the resonator substrate member, patterning the cut-out portion; etching the cut-out portion to form a cut-out part; and stripping the second corrosion-resistant film.

In this case, since forming of the inverted-mesa and widening of the penetrating hole are made at the same time, whole the steps of forming the resonator substrate member may be shortened.

In the method, it is preferable that the resonator substrate member be made of quartz crystal, and the etching be preformed by wet etching.

In this case, the penetrating hole is formed by wet etching the resonator substrate member made of quartz crystal. Thus, the internal surface of the penetrating hole may be tapered due to crystal anisotropy of quartz crystal to allow easily forming an electrode on the internal surface.

In the method, it is preferable that the resonator substrate member have the main surface parallel with an X-axis as a crystal axis of the quartz crystal, and the penetrating hole be formed in a positive direction of the X-axis with respect to the resonator element.

In this case, the internal surface of the penetrating hole formed on the side of resonator element in the negative direction of the X-axis may have an inclination more steeply than that in the positive direction of the X-axis due to anisotropy of wet etching for the crystal axis of quartz crystal, and the first excitation electrode is electrically connected to the third electrode. Thus, the area of internal surface of the penetrating hole view from the main surface direction may be reduced. Therefore, increased in size may be the resonator element which is included in the piezoelectric resonator after cutting. Further, since the concave portion has the steeply inclined side surface, it may be reduced that the first excitation electrode and the third electrode are electrically disconnected at the side surface of the concave portion.

BRIEF DESCRIPTION OF THE DRAWINGS

The invention will be described with reference to the accompanying drawings, wherein like numbers reference like elements.

FIG. 1A is a perspective view of a piezoelectric resonator according to a first embodiment of the invention.

FIG. 1B is a cross-sectional view taken along a line A-A of FIG. 1A.

FIG. 2 is an exploded perspective view of the piezoelectric resonator.

FIG. 3A is a plan view of the resonator substrate seen from the side of a lid substrate.

FIG. 3B is a plan view of the resonator substrate seen from the side of a base substrate.

FIGS. 5A to 5F are schematic views showing a manufacturing process.

DESCRIPTION OF EXEMPLARY EMBODIMENTS

Figure 4:
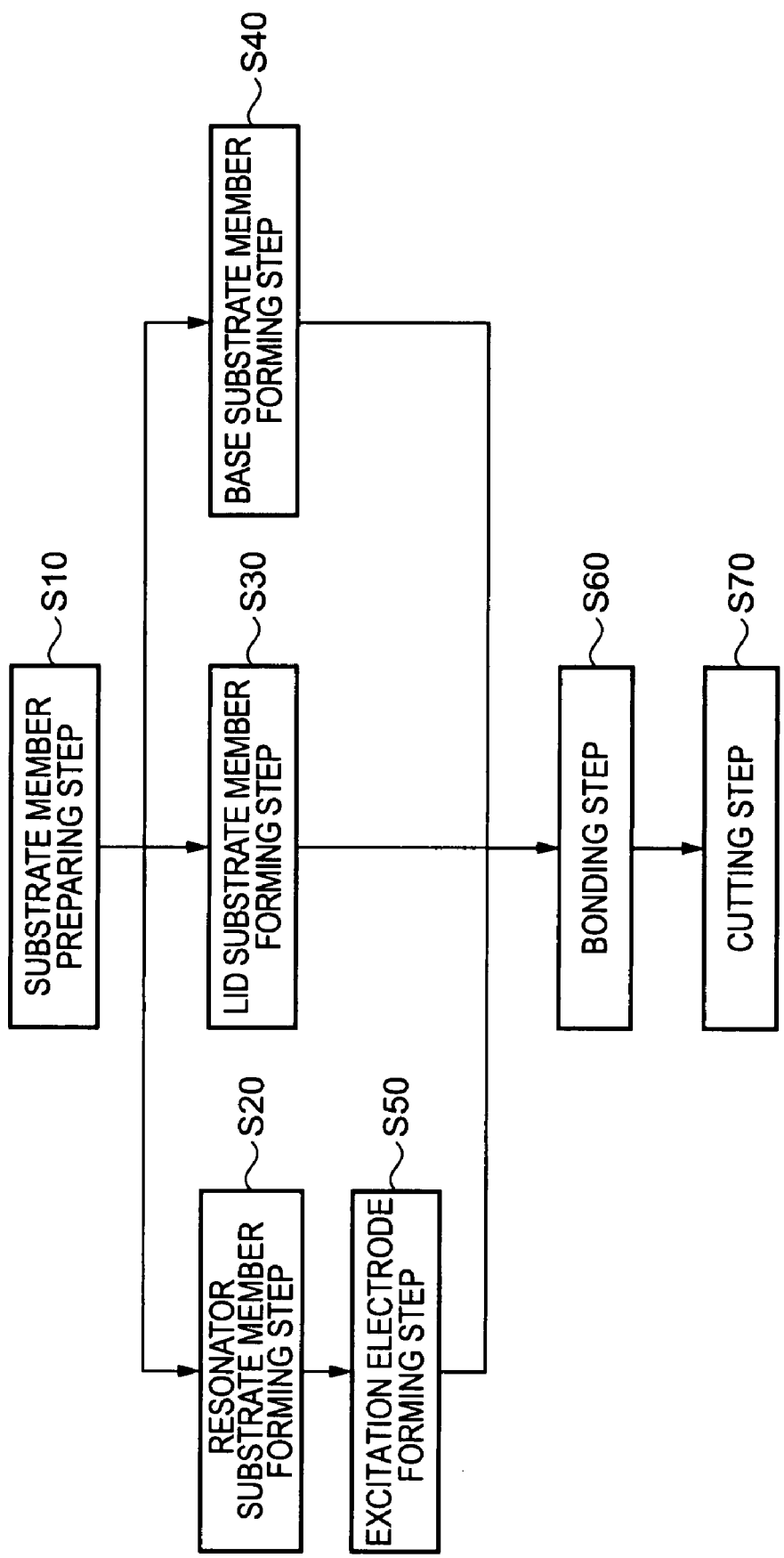
FIG. 4 is a manufacturing flow chart showing a manufacturing method according to the first embodiment of the invention.

Hereinafter, a description will be given of embodiments and modified examples embodying the invention with reference to the drawings. It should be noted that the description is made in such a way that the same component parts are denoted by the same reference numerals in the drawings of the embodiments and the modified examples.

First Embodiment

FIGS. 1A and 1B show a piezoelectric resonator 1 according to a first embodiment of the invention.

FIG. 1A is a perspective view of the piezoelectric resonator 1 and FIG. 1B is a cross-sectional view taken along a line A-A of FIG. 1A.

FIG. 2 is an exploded perspective view of the piezoelectric resonator 1. The piezoelectric resonator 1 includes a lid substrate 2, a resonator substrate 3 and a base substrate 4.

FIG. 3A a plan view of the resonator substrate 3 seen from the side of the lid substrate 2, FIG. 3B is a plan view of the resonator substrate 3 seen from the side of the base substrate 4.

Referring to FIGS. 1A and 2, the piezoelectric resonator 1 is constructed such that the base substrate 4 supports the resonator substrate 3, and the lid substrate 2 is stacked thereon. The resonator substrate 3 is sandwiched and bonded between the lid substrate 2 and the base substrate 4.

The base substrate 4 is a substantially rectangular plate and has four side surfaces intersecting at four corners each of which is provided with a notch. The notch has a side surface formed thereon with an external electrode 41 or 42.

The resonator substrate 3 is a plate having substantially the same outer shape as the base substrate 4. One of side surfaces of the resonator substrate 3 is provided with two concave portions 35.

The lid substrate 2 also is a plate having substantially the same outer shape as the base substrate 4. The lid substrate 2 has side surfaces without being processed.

Referring to FIG. 1B and FIG. 2, the resonator substrate 3 is provided with a resonator element 33 surrounded by a frame part 30. The resonator substrate 3 is made of quartz crystal. The resonator element 33 is a rectangular parallelepiped with a main surface of an oblong rectangle. Here, the resonator substrate 3 is formed using AT cut, the main surface thereof is a plane perpendicular to a Y'-axis, and the side surfaces thereof are substantially perpendicular to a Z'-axis and an X-axis as a crystal axis (see FIG. 2).

The resonator element 33 has a thickness thinner than that of the resonator substrate 3, and is supported by two support parts 34 opposed to each other which are extended from the frame part 30 in a Z'-axis direction. Therefore, the resonator element 33 is sealed in a space surrounded by the lid substrate 2 and the base substrate 4 (see FIG. 1B).

The two concave portions 35 are formed on the resonator substrate 3 made of quartz crystal at the side surface positioned in a positive direction of the X-axis indicated by an arrow in FIG. 2.

Referring to FIGS. 3A and 3B, formed on the resonator substrate 3 are a first excitation electrode 31, a second excitation electrode 32, and a third electrode 36 as an electrode for extraction which are indicated by an obliquely shaded area. Referring to FIG. 3A, the first excitation electrode 31 is provided on the surface of the resonator substrate 3 facing the lid substrate 2. Specifically, the first excitation electrode 31 is provided continuously on the resonator element 33, the two support parts 34 and the frame part 30 of the resonator substrate 3 facing the lid substrate 2. Further, the excitation electrode 31 is provided to the side surface of each of the concave portions 35.

Referring to FIG. 3B, the second excitation electrode 32 is provided to the surface of the resonator substrate 3 facing the base substrate 4. Specifically, the second excitation electrode 32 is provided on the resonator element 33, the two support parts 34 and the frame part 30 of the resonator substrate 3 facing the base substrate 4. Here, the excitation electrode 32 is not provided in the vicinity of the concave portions 35. Provided in the vicinity of the concave portions 35 is the third electrode 36 which is electrically disconnected from the second excitation electrode 32 by interposing a surface 37 provided with no electrode between the second excitation electrode 32 and the third electrode 36. Further, the third electrode 36 is also provided to the side surface of each of the concave portions 35.

The first excitation electrode 31 and the third electrode 36 which are provided to the side surface of the concave portion 35 are electrically connected to each other at the side surface. Therefore, the first excitation electrode 31 formed on the surface of the resonator substrate 3 facing the lid substrate 2 is extracted to the surface of the resonator substrate 3 facing the base substrate 4. The first excitation electrode 31 and the second excitation electrode 32 are electrically disconnected by the surface 37.

In a state where the resonator substrate 3 and the base substrate 4 are bonded, the third electrode 36 is connected to the external electrode 41, and the second excitation electrode 32 is connected to the external electrode 42. Therefore, the first excitation electrode 31 and the second excitation electrode 32 formed on both main surfaces of the resonator element 33 may be connected to a mounting substrate and the like via the external electrodes 41 and 42 at the bottom of the base substrate 4.

Next, described is a method for manufacturing the piezoelectric resonator 1 with reference to the drawings.

FIG. 4 is a manufacturing flow chart showing the method for manufacturing the piezoelectric resonator 1.

FIGS. 5A to 5F are schematic views showing a manufacturing process. A lot of piezoelectric resonators are formed on a substrate member as a large sized substrate and cut into individual piezoelectric resonators 1

Referring to FIG. 4, the method of manufacturing the piezoelectric resonator 1 includes a substrate member preparing step S10, a resonator substrate member forming step S20, a lid substrate member forming step S30, a base substrate member forming step S40, an excitation electrode forming step S50, a bonding step S60 and a cutting step S70.

FIG. 5A shows the substrate member preparing step S10 for preparing a lid substrate member 200, a resonator substrate member 300 and base substrate member 400 each as a large sized substrate.

Referring to FIG. 5A, the lid substrate member 200 and the base substrate member 400 may use a glass substrate or a quartz crystal substrate. The resonator substrate member 300 uses a quartz crystal substrate. Here, the resonator substrate member 300 is produced using AT cut. A main surface of the resonator substrate member 300 is a plane perpendicular to the Y'-axis, and side surfaces of the resonator substrate member 300 are substantially perpendicular to the Z'-axis or the X-axis as the crystal axis.

FIG. 5B shows the resonator substrate member forming step S20 for forming on the resonator substrate member 300 a plurality of resonator elements 33 and the like and a plurality of penetrating holes 305 to make a resonator substrate member 310. A part of each of the penetrating holes 305 is to be the concave portion 35 and corresponds to the resonator element 33. FIG. 5B also shows the lid substrate member forming step S30 and the base substrate member forming step S40. The base substrate member forming step S40 is for forming on the base substrate member 400 a plurality of holes 420 each of which is to be the notch formed thereon with the external electrode 41 to make a base substrate member 410.

Referring to FIG. 5B, both surfaces of the resonator substrate member 300 are masked and subjected to wet etching to form the resonator element 33 and the support part 34 shown in FIG. 2. Two penetrating holes 305 are formed by wet etching close to each resonator element 33 in the positive direction of the X-axis. Wet etching is preformed from both main surfaces to obtain the penetrating hole 305 with a small opening diameter. An internal surface of the penetrating hole 305 is tapered from the opening toward the inside due to anisotropy of the crystal axis of quartz crystal. Wet etching is performed using hydrofluoric acid and the like.

Formed on the base substrate member 400 by sandblast are the holes 420 to be the notch on which the external electrodes 41 and 42 are formed to form the base substrate member 410.

FIG. 5C shows the excitation electrode forming step S50.

Referring to FIG. 5C, formed on one of the main surfaces of the resonator substrate member 310 is a first excitation electrode 321 (excitation electrode 31) indicated by a lot of dots in FIG. 5C so as to extend to the resonator element 33 and the internal surfaces of the penetrating hole 305. Further, formed on the other main surface of the resonator substrate member 310 is the second excitation electrode 32 (not shown) and the third electrode 36 (not shown) so as to extend to the internal surface of the penetrating hole 305 to form the resonator substrate member 320. The first excitation electrode 321 (excitation electrode 31), the second excitation electrode 32 and the third electrode 36 may be formed by deposition, sputtering and the like. Here, since the internal surface of the penetrating hole 305 is tapered from the opening toward the inside, the electrode is formed on the internal surface of the penetrating hole 305. The first excitation electrode 31 is electrically connected to the third electrode 36 at the internal surface of the penetrating hole 305 by performing deposition, sputtering and the like from both main surfaces.

FIG. 5D shows the bonding step S60 for bonding the lid substrate member 200, the resonator substrate member 320 and the base substrate member 410.

Referring to FIG. 5D, the lid substrate member 200 is bonded to the resonator substrate member 320 with respect to the surface formed with the first excitation electrode 321. The base substrate member 410 is bonded to the resonator substrate member 320 with respect to the surface formed with the second excitation electrode 32 (not shown) in such a manner that the resonator element 33 corresponds to the relevant hole 420.

The lid substrate member 200, the resonator substrate member 320 and the base substrate member 410 may be bonded by eutectic metal bonding such as Au—Sn eutectic bonding, anodic bonding and plasma bonding.

FIG. 5E shows a collective body 100 of the piezoelectric resonator 1 after bonding.

FIG. 5F shows the cutting step S70 for cutting and separating the collective body 100 of the piezoelectric resonator 1 into individual piezoelectric resonators 1 to obtain the piezoelectric resonator 1.

Referring to FIG. 5F, the collective body 100 of the piezoelectric resonator 1 is cut and separated to obtain the piezoelectric resonator 1. Details thereof are described in the following.

Figure 6A:
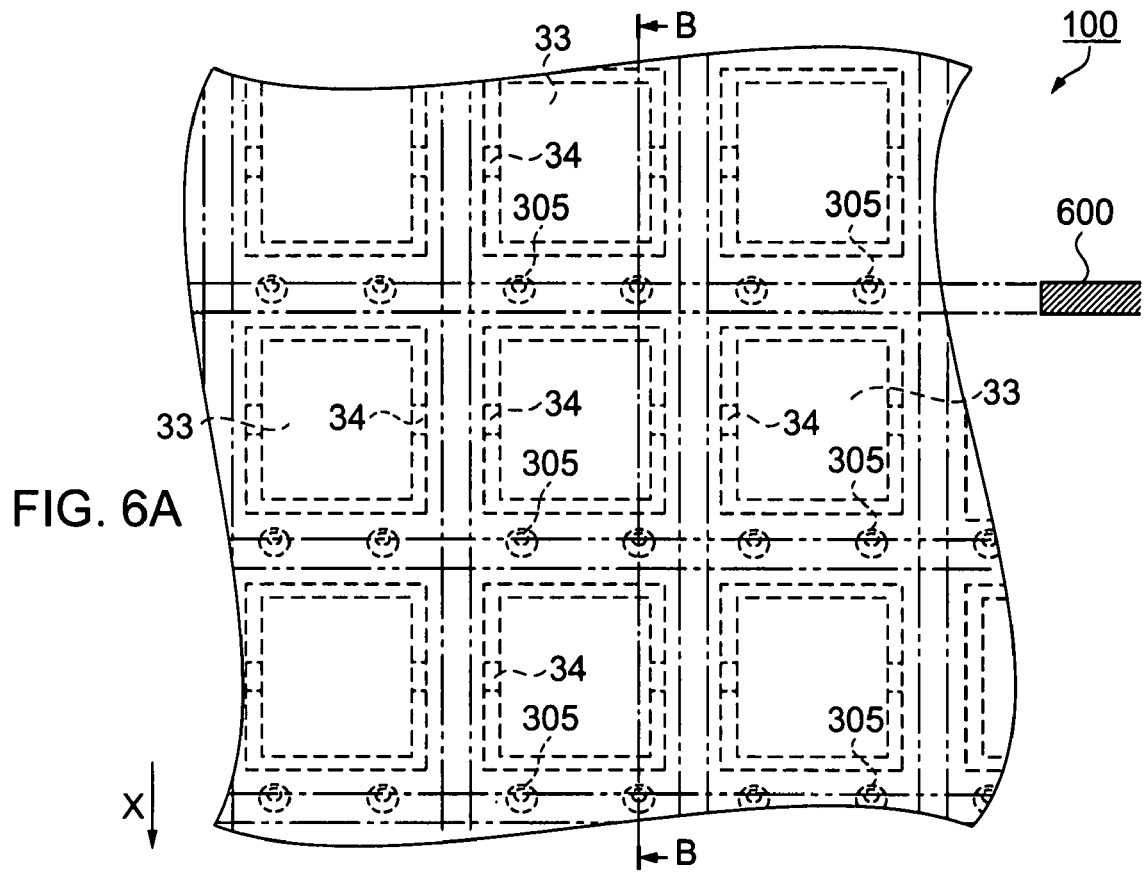
FIG. 6A is a partial plan view of a collective body of the piezoelectric resonator before cutting according to the first embodiment.
Figure 6B:
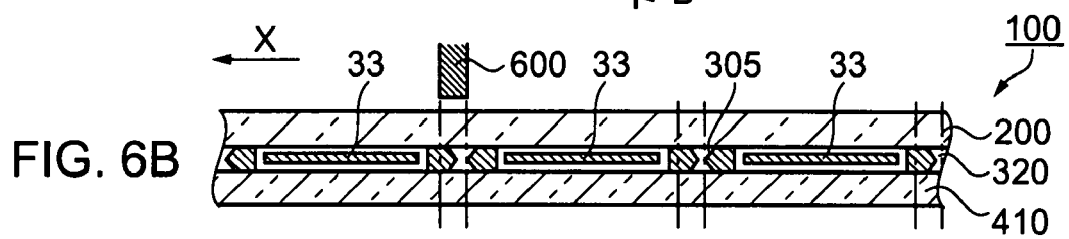
FIG. 6B is a partial cross-sectional view taken along a line B-B of FIG. 6A.
Figure 7:
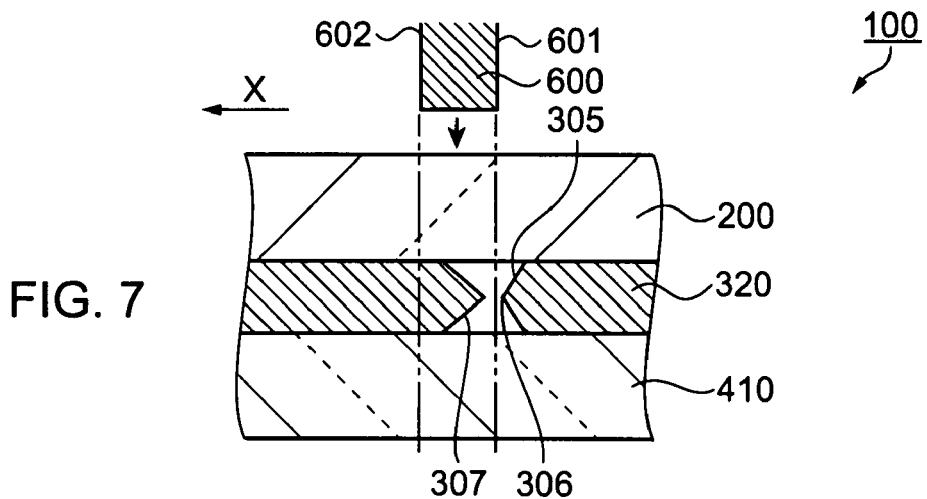
FIG. 7 is an enlarged partial cross-sectional view of FIG. 6B.

FIGS. 6A, 6B and 7 are diagrams showing details of the step of cutting and separating the piezoelectric resonators 1. FIG. 6A is a partial plan view of the collective body 100 of the piezoelectric resonator 1, and FIG. 6B is a cross-sectional view taken along a line B-B of FIG. 6A.

FIG. 7 is an enlarged partial cross-sectional view of FIG. 6B.

Referring to FIGS. 6A, 6B and 7, the collective body 100 is cut across the penetrating holes 305 along a portion indicated by a two-dot chain line in FIG. 6A by a blade 600. Here, the internal surface of the penetrating hole 305 is asymmetric due to anisotropy of quartz crystal for wet etching. Specifically, the internal surface in the negative direction of the X-axis is inclined more steeply than an internal surface 307 etched in the positive direction of the X-axis (see FIG. 7).

Description is given of a cutting position of the blade 600 in detail.

Referring to FIG. 7, the blade 600 is set as follows to perform cutting. One edge 601 of the blade 600 is set so as not to contact to an apex part 306 of the internal surface of the penetrating hole 305 in the negative direction of the X-axis. The other edge 602 of the blade 600 is set so as to cut off all of the internal surface 307 of the penetrating hole 305 in the positive direction of the X-axis. As a result, the apex part 306 of the internal surface of the penetrating hole 305 in the negative direction of the X-axis is positioned more inside than the side surface of the piezoelectric resonator 1 after cutting.

For example, a relationship between the penetrating hole 305 and the blade 600 is as follow.

In a case that the penetrating hole 305 is formed by wet etching from both sides of the resonator substrate member 300, the relationship between the resonator substrate member 300 and a minimum penetrating hole diameter of the penetrating hole 305 is as below. If a thickness of the resonator substrate member 300 is 100 μm, a diameter of the opening of the penetrating hole 305 is approximately 90 μm in the X-axis direction and 150 μm in the Z'-axis direction. In this case, the blade 600 with a width of 90 μm may be used.

It should be noted that the minimum penetrating hole diameter means the minimum diameter of the opening of the penetrating hole 305 at the time when the penetrating hole 305 is formed in the case that wet etching is performed from both sides of the resonator substrate member and the resonator substrate member 300 is penetrated through. The diameter of the opening of the penetrating hole 305 may be larger than 90 μm in the X-axis direction and 150 μm in the Z'-axis direction.

The following is the minimum penetrating hole diameter corresponding to the thickness of the resonator substrate member 300.

The minimum penetrating hole diameter is approximately 70 μm in the X-axis direction and 120 μm in the Z'-axis direction in a case where the thickness of the resonator substrate member 300 is 80 μm, and approximately 55 μm in the X-axis direction and 90 μm in the Z'-axis direction in a case where the thickness of the resonator substrate member 300 is 60 μm.

The piezoelectric resonator 1 can be obtained by the above processes.

The advantageous effect of the first embodiment will be described in the following.

1. The first excitation electrode 31 formed on one surface of the resonator element 33 is electrically connected to the third electrode 36 formed on the surface on which the second excitation electrode 32 is formed via the concave portions 35 on the side surface of the resonator substrate 3. Therefore, the first excitation electrode 31 can be collected to the surface on which the second excitation electrode 32 is formed to allow the piezoelectric resonator to be mounted with one surface thereof. Further, the electrical connecting is made between the first excitation electrode 31 and the third electrode 36 via the side surface, not via the through-hole. Hence, the resonator substrate 3 dose not need an area to be penetrated, and may have a smaller size compared to that using the same sized resonator element 33. As a result, the piezoelectric resonator 1 reduced in size can be obtained.

Moreover, since the first excitation electrode 31 is electrically connected to the third electrode 36 via the concave portions 35, it is able to reduce electrical disconnection and discharge due to contact from the outside.

2. The penetrating hole 305 is formed by wet etching the resonator substrate member 300 made of quartz crystal, and the concave portion 35 is formed using the penetrating hole 305. Therefore, the side surface of the concave portion 35 may be tapered due to crystal anisotropy of quartz crystal to allow easily forming an electrode on the side surface.

3. The side surface of the concave portion 35 provided to the side surface of the resonator substrate 3 may have an inclination more steeply than that in the positive direction of the X-axis due to crystal anisotropy of the X-axis as the crystal axis of quartz crystal. Therefore, the area ratio of the concave portion 35 to the resonator substrate 3 may be decreased, and the resonator element 33 may occupy a large area in the resonator substrate 3. Since the concave portion 35 has the steeply inclined side surface, it may be reduced that the first excitation electrode 31 and the third electrode 36 are electrically disconnected at the side surface of the concave portion 35.

4. The first excitation electrode 321 provided to one surface of the resonator substrate member 300 may be electrically connected to the third electrode 36 formed on the other surface of the resonator substrate member 300 on which is formed the second excitation electrode 32 via the penetrating hole 305 of the resonator substrate member 300. Cutting is performed so as to leave a part of the internal surface of the penetrating hole 305, which part is on the side of the resonator element 33 corresponding to the penetrating hole 305, to obtain the piezoelectric element. Therefore, the first excitation electrode 31 may be collected to the surface on which the second excitation electrode 32 is formed to obtain the piezoelectric resonator capable of being mounted with one surface of the package. Further, the electrical connecting is made between the first excitation electrode 321 and the third electrode 36 via a part of the internal surface of the penetrating hole 305, not via the through-hole, and cutting is performed along the penetrating holes 305. Thus, it is not necessary to provide particularly the through-hole to the resonator substrate member 300, allowing piezoelectric resonator to have a smaller size compared to that using the same sized resonator element 33. As a result, the number of the piezoelectric resonator 1 obtained from one resonator substrate member 300 may be increased.

5. The penetrating hole 305 is formed by wet etching the resonator substrate member 300 made of quartz crystal. Thus, the internal surface of the penetrating hole 305 may be tapered due to crystal anisotropy of quartz crystal to allow easily forming an electrode on the internal surface.

6. The internal surface of the penetrating hole 305 formed on the side of resonator element 33 in the negative direction of the X-axis may have an inclination more steeply than that in the positive direction of the X-axis due to anisotropy of wet etching for the crystal axis of quartz crystal, and the first excitation electrode 321 is electrically connected to the third electrode 36. Thus, the area of the internal surface of the penetrating hole 305 view from the main surface direction may be reduced. Therefore, increased in size may be the resonator element 33 which is included in the piezoelectric resonator 1 after cutting.

7. As shown in FIG. 7, cutting is performed in such a manner that one edge 601 of the blade 600 dose not contact to the apex part 306 in internal surface of the penetrating hole 305. Thus, force and vibration are not readily transmitted, there may hardly occur so-called chipping, that is chipping of the resonator substrate member 320 on the side of the apex part 306 in the internal surface in the negative direction of the X-axis.

8. The apex part 306 has an angle blunter than that of an apex part of the internal surface 307. Thus, in the case of connecting the first excitation electrode 31 and the third electrode 36, disconnection at the apex part 306 may hardly occur compared to the apex part of the internal surface 307.

Second Embodiment

Figure 8A:
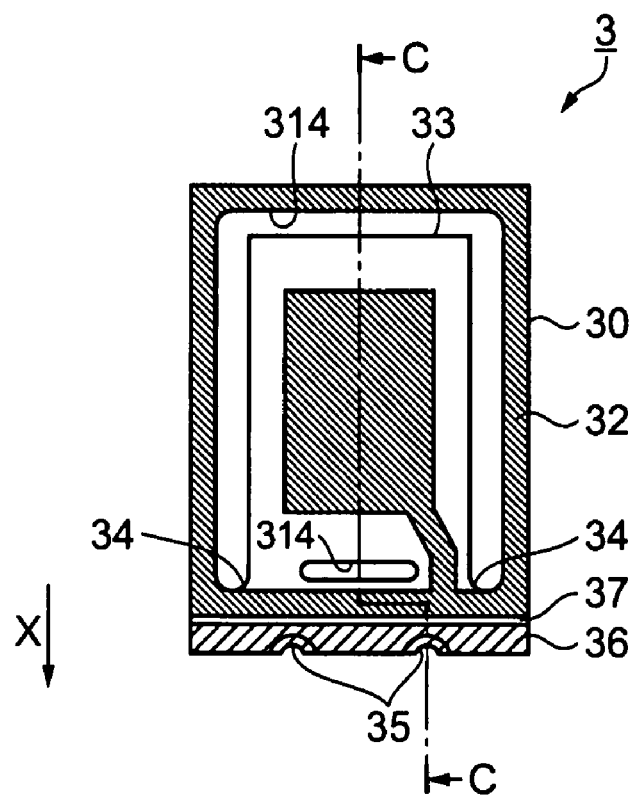
FIG. 8A is a plan view of the resonator substrate seen from the side of the base substrate according to a second embodiment of the invention.
Figure 8B:
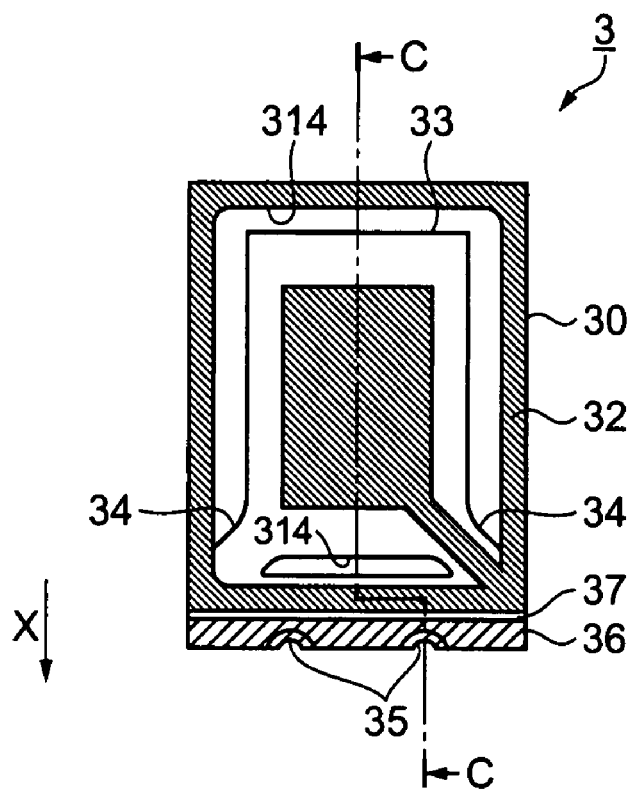
FIG. 8B is a plan view of another resonator substrate seen from the side of the base substrate.

FIGS. 8A and 8B show two types of resonator substrates 3 according to a second embodiment of the invention.

FIG. 8A is a plan view of the resonator substrate 3 seen from the side of the base substrate 4. FIG. 8B is a plan view of another resonator substrate 3 seen from the side of the base substrate 4.

Referring to FIG. 8A, the support part 34 of the resonator element 33 is arranged along with the frame part 30 on the side of the concave portion 35. Between the resonator element 33 and the frame part 30 a cut-out part 314 is defined.

The second excitation electrode 32 is provided to the surface of the resonator substrate 3 facing the base substrate 4. Specifically, the second excitation electrode 32 is provided on the resonator element 33, one of the two support parts 34 and the frame part 30 of the resonator substrate 3 facing the base substrate 4. Here, the excitation electrode 32 is not provided in the vicinity of the concave portions 35. Provided in the vicinity of the concave portions 35 is the third electrode 36 which is electrically disconnected from the second excitation electrode 32 by interposing a surface 37 provided with no electrode between the second excitation electrode 32 and the third electrode 36. Further, the third electrode 36 is also provided to the side surface of each of the concave portions 35.

The resonator substrate 3 of FIG. 8B is different from that of FIG. 8A in that two support parts 34 are provided at corners of the frame part 30 on the side of the concave portion 35. Other configurations are the same as the resonator substrate 3 shown in FIG. 8A.

In the second embodiment, the resonator substrate member forming step S20 of the first embodiment is performed with steps as below. Other steps are the same as those in the first embodiment. The resonator substrate member 310 is obtained by processing the resonator substrate member 300 as follow.

Figure 9:
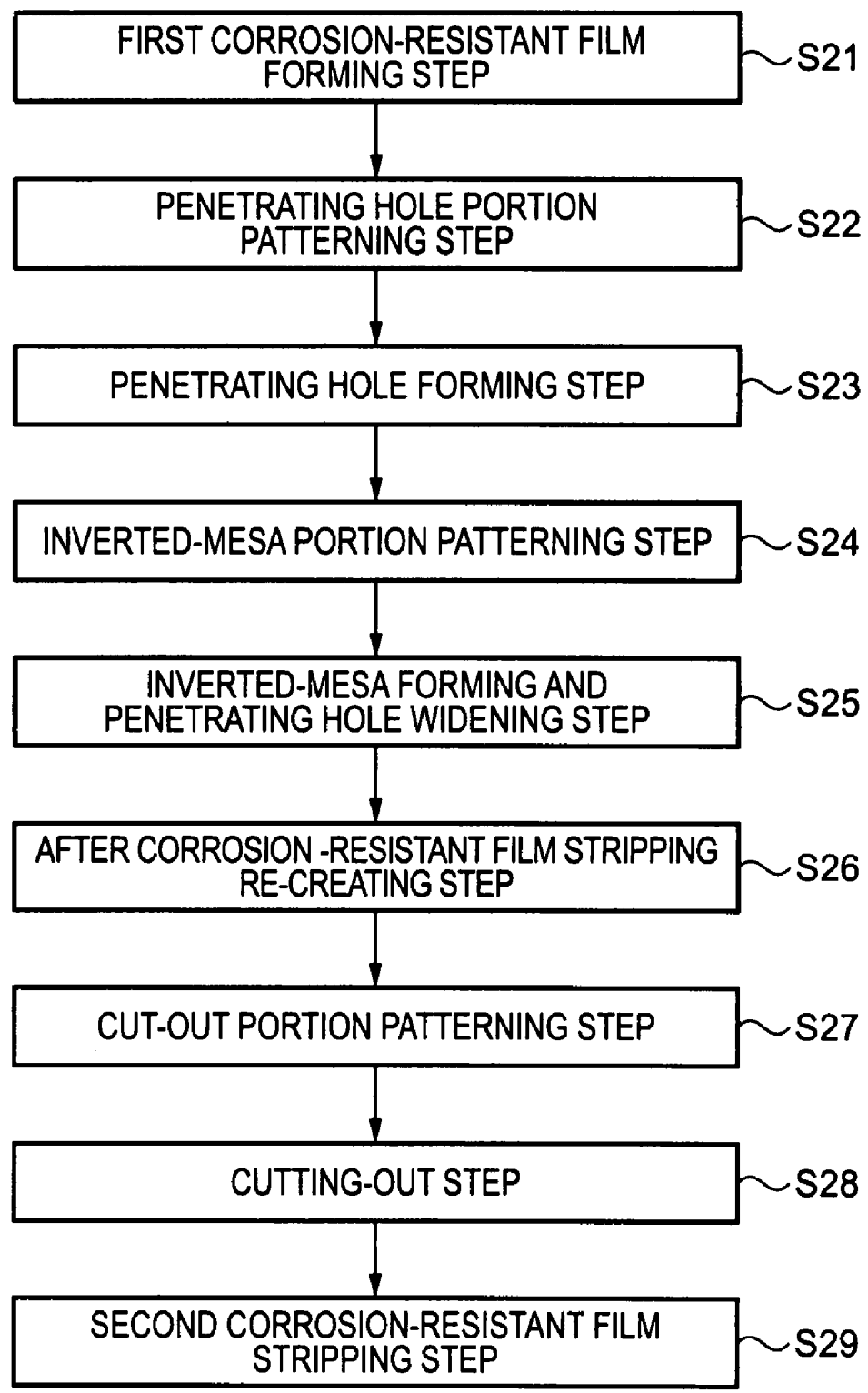
FIG. 9 is a manufacturing flow chart showing a resonator substrate member forming step according to the second embodiment of the invention.

FIG. 9 is a manufacturing flow chart showing a resonator substrate member forming step S20.

FIG. 10 is a schematic cross-sectional view based on a cross-sectional view taken along a line C-C of FIGS. 8A and 8B, and showing the resonator substrate member forming step S20.

Referring to FIG. 9, the resonator substrate member forming step S20 includes a first corrosion-resistant film forming step S21, a penetrating hole portion patterning step S22, a penetrating hole forming step S23, an inverted-mesa portion patterning step S24, an inverted-mesa forming and penetrating hole widening step S25, an after corrosion-resistant film stripping re-creating step S26, a cut-out portion patterning step S27, a cutting-out step S28, and a second corrosion-resistant film stripping step S29.

Figure 10A:
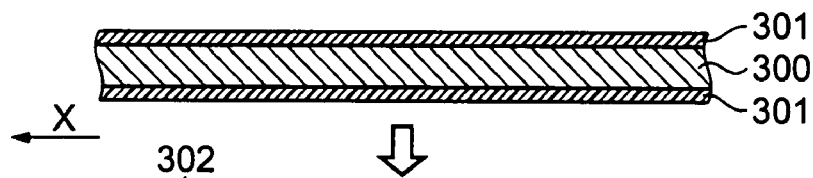
FIGS. 10A to 10J are schematic cross-sectional views based on a cross-sectional view taken along a line C-C of each of FIGS. 8A and 8B, and showing the resonator substrate member forming step.

FIG. 10A shows the first corrosion-resistant film forming step S21 for forming a first corrosion-resistant film 301 on both main surfaces of the resonator substrate member 300.

Referring to FIG. 10A, the first corrosion-resistant film 301 is formed on both main surfaces of the resonator substrate member 300. The first corrosion-resistant film 301 may be formed by laminating a chromium film and a gold film on the main surface of the resonator substrate member 300. The first corrosion-resistant film is formed, for example, with the chromium film of thickness several tens nm, and the gold film of thickness from several tens to several hundreds nm.

Figure 10B:
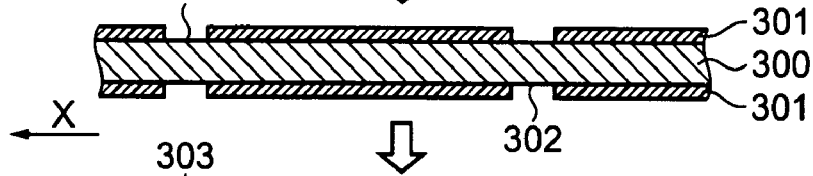

FIG. 10B shows the penetrating hole portion patterning step S22 for removing the first corrosion-resistant film 301 in a penetrating hole portion 302 to be formed with the penetrating hole 305.

Referring to FIG. 10B, the first corrosion-resistant film 301 on the penetrating hole portion 302 is removed by a photolithography process using a mask and an acid stripping liquid for the first corrosion-resistant film.

Figure 10C:
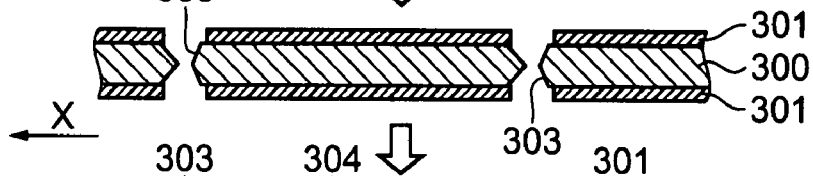

FIG. 10C shows the penetrating hole forming step S23 for forming a penetrating hole 303 in the penetrating hole portion 302 from which the first corrosion-resistant film 301 has been removed.

Referring to FIG. 10C, wet etching is performed to the penetrating hole portion 302 from both surfaces of the resonator substrate member using hydrofluoric acid and the like to form the penetrating hole 303. A time period of wet etching in this step may be determined considering a time period of etching in a later step of the inverted-mesa forming and penetrating hole widening step S25. The penetrating hole 305 has finally a diameter of the opening determined by the time period of wet etching in this step S23 and the time period of etching in the inverted-mesa forming and penetrating hole widening step S25.

Figure 10D:
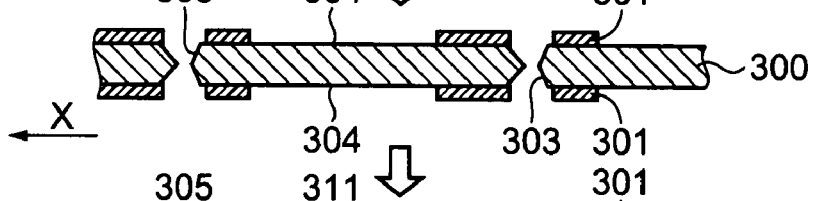

FIG. 10D shows the inverted-mesa portion patterning step S24 for removing the first corrosion-resistant film 301 on an inverted-mesa portion 304 in which is formed the resonator element 33.

Referring to FIG. 10D, the first corrosion-resistant film 301 on the inverted-mesa portion 304 is removed by the photolithography process the same as that in the penetrating hole portion patterning step S22.

Figure 10E:
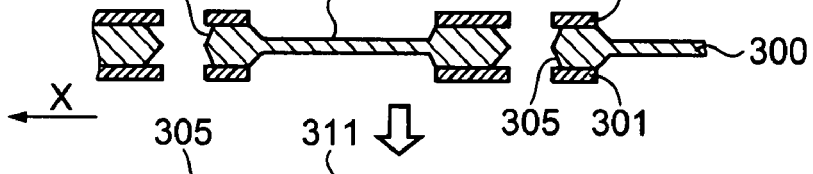

FIG. 10E shows the inverted-mesa forming and penetrating hole widening step S25 for etching the inverted-mesa portion 304 from which is removed the first corrosion-resistant film 301 to form a inverted-mesa and etching the penetrating hole 303 to be widened at the same time.

Referring to FIG. 10E, wet etching is performed by the hydrofluoric acid and the like so that the inverted-mesa portion 304 is etched to form an inverted-mesa structure 311. At the same time the penetrating hole 303 is etched and widened to form the penetrating hole 305 having a predetermined opening diameter. The predetermined diameter may be determined depending on the thickness of the resonator substrate member 300, the width of the blade 600 shown in FIG. 7 used in the cutting step S70 shown in FIG. 4, and the like.

Figure 10F:
Figure 10G:
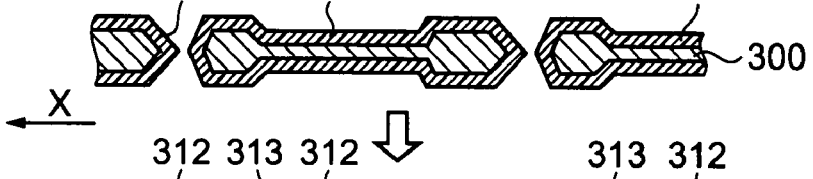

FIGS. 10F and 10G show the after corrosion-resistant film stripping re-creating step S26 for stripping the first corrosion-resistant film 301 and forming a second corrosion-resistant film 312 on the surface of resonator substrate member 300 from which has been removed the first corrosion-resistant film 301.

Referring to FIGS. 10F and 10G, the first corrosion-resistant film 301 may be stripped using the same stripping liquid as in the penetrating hole portion patterning step S22. The second corrosion-resistant film 312 may be formed in a similar manner to the first corrosion-resistant film 301.

Figure 10H:
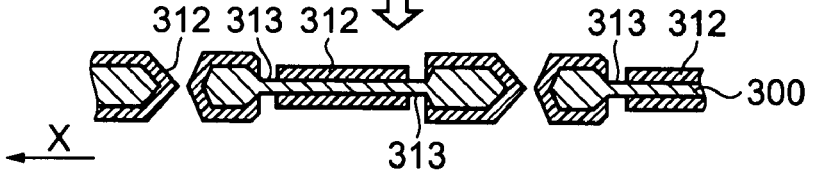

FIG. 10H shows the cut-out portion patterning step S27 for removing the second corrosion-resistant film 312 on a cut-out portion 313 between the resonator element 33 and the resonator substrate member 300.

Referring to FIG. 10H, the second corrosion-resistant film 312 on the cut-out portion 313 is removed by the same photolithography process as in the penetrating hole portion patterning step S22.

Figure 10I:
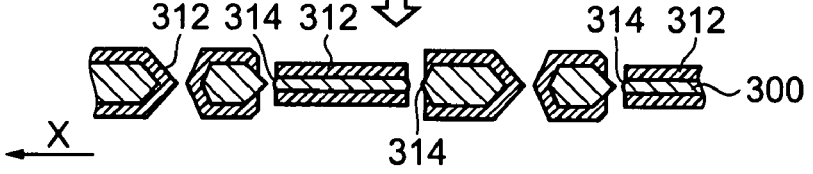

FIG. 10I shows the cutting-out step S28 for etching cut-out portion 313 to form a cut-out part 314.

Referring to FIG. 10I, the cut-out portion 313 may be etched by wet etching the same as in the penetrating hole forming step S23.

Figure 10J:
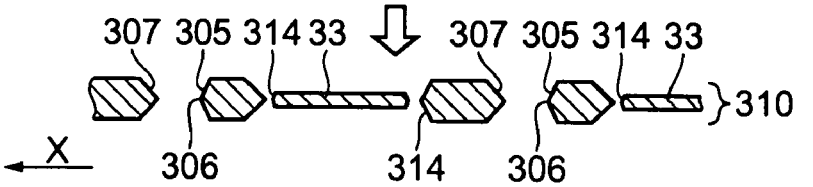

FIG. 10J shows the second corrosion-resistant film stripping step S29.

Referring to FIG. 10J, the second corrosion-resistant film 312 may be stripped by the same stripping liquid as used for the first corrosion-resistant film 301.

The the resonator substrate member 310 can be obtained by the above-described steps The advantageous effect of the second embodiment will be described in the following.

9. In addition to the advantageous effect described above, since forming of the inverted-mesa and widening of the penetrating hole are made at the same time, whole the steps of forming the resonator substrate member may be shortened.

It should be noted that the invention is not limited to the above-described embodiments, and includes changes and modifications within a scope that may achieve the advantages of the invention.

Figure 11:
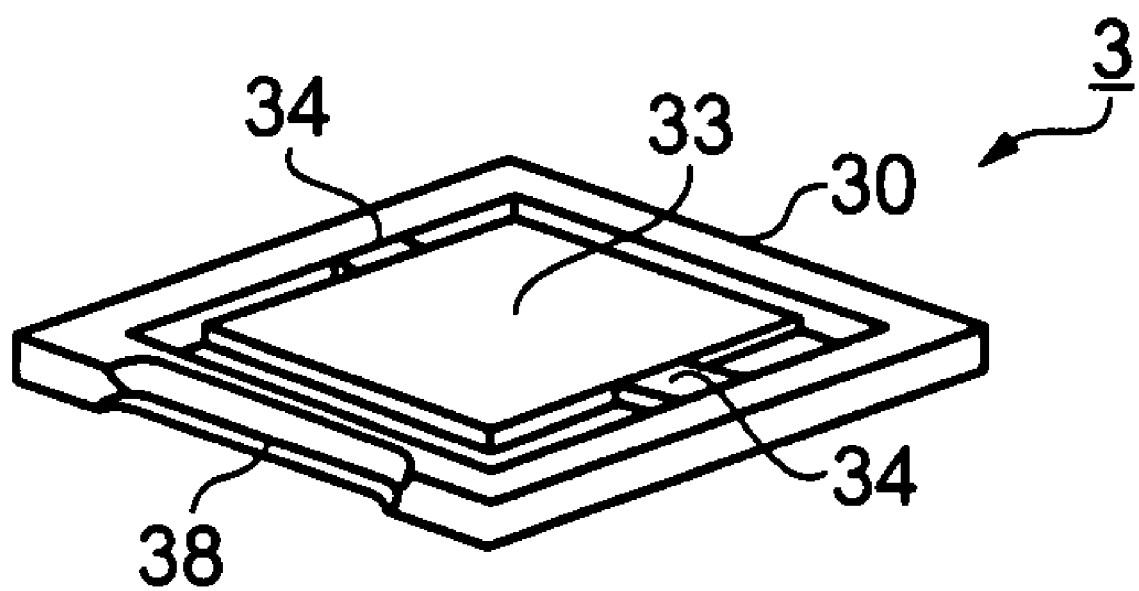
FIG. 11 is a perspective view of the piezoelectric resonator according to a modified example.

For example, as a modified example referring to FIG. 11, the concave portions 35 provided to the resonator substrate 3 are not necessary to be separated into two as in the embodiment and may be a concave portion 38 of continuous shape.

The entire disclosure of Japanese Patent Application Nos: 2006-127407, filed May 1, 2006 and 2007-406583, Feb. 27, 2007 are expressly incorporated by reference herein.

What is claimed is:

1. A piezoelectric resonator comprising:
   a resonator substrate made of a quartz crystal and having a side surface in a direction of an X-axis as a crystal axis of the quartz crystal;
   a base substrate supporting the resonator substrate;
   a lid substrate covering a surface of the resonator substrate, the surface being on an opposite side of a surface facing the base substrate;
   a first excitation electrode formed on the surface of the resonator substrate facing the lid substrate;
   a second excitation electrode formed on the surface of the resonator substrate facing the base substrate, and
   a third electrode provided on the surface of the resonator substrate facing the base substrate, the third electrode being electrically connected to the first excitation electrode through a concave portion which is formed on a side surface of the resonator substrate in a positive direction of the X-axis.

* * * * *